US006663683B2

(12) United States Patent
Lortz et al.

(10) Patent No.: US 6,663,683 B2
(45) Date of Patent: Dec. 16, 2003

(54) AQUEOUS DISPERSIONS, PROCESS FOR THEIR PRODUCTION, AND THEIR USE

(75) Inventors: Wolfgang Lortz, Wächtersbach (DE); Christoph Batz-Sohn, Hanau-Mittelbuchen (DE); Gabriele Perlet, Grosskrotzenburg (DE); Werner Will, Gelnhausen (DE)

(73) Assignee: Degussa AG, Dusseldorf (DE)

( * ) Notice: Subject to any disclaimer, the term of this patent is extended or adjusted under 35 U.S.C. 154(b) by 56 days.

(21) Appl. No.: 09/985,184

(22) Filed: Nov. 1, 2001

(65) Prior Publication Data

US 2002/0095873 A1 Jul. 25, 2002

(30) Foreign Application Priority Data

Nov. 2, 2000 (DE) ........................................ 100 54 345

(51) Int. Cl.[7] ............................ C09C 1/68; C09G 1/02; C09K 3/14; B01F 3/00; B01F 17/00

(52) U.S. Cl. ............................... 51/308; 51/309; 106/3; 438/692; 438/693; 428/689; 428/446; 428/426; 428/537.5; 428/688; 162/181.6

(58) Field of Search .......................... 51/307, 309, 308; 106/3; 252/79.1, 79.5; 438/692, 693; 428/446, 426, 537.5, 688, 689; 162/181.6

(56) References Cited

U.S. PATENT DOCUMENTS

| | | | | | |
|---|---|---|---|---|---|
| 5,897,675 | A | * | 4/1999 | Mangold et al. | 51/309 |
| 5,904,159 | A | * | 5/1999 | Kato et al. | 134/7 |
| 6,063,354 | A | | 5/2000 | Mangold et al. | |
| 6,328,944 | B1 | * | 12/2001 | Mangold et al. | 423/278 |

FOREIGN PATENT DOCUMENTS

| | | | | |
|---|---|---|---|---|
| DE | 19650500 | A1 | * | 6/1998 |
| DE | 198 47 161 | A1 | | 4/2000 |
| EP | 0 826 757 | A1 | | 3/1998 |
| EP | 0 855 368 | A1 | | 7/1998 |
| EP | 0 874 036 | A1 | | 10/1998 |
| WO | WO 99/08838 | | | 2/1999 |
| WO | WO 00/13218 | | | 3/2000 |

OTHER PUBLICATIONS

Search Report and Examination Report of the Austrian Patent Office (based on search performed by the Singapore Intellectual Property Office, dated Jun. 3, 2002, for Austrian Patent Application No. 200106589–5, 8 pps.

* cited by examiner

*Primary Examiner*—Michael Marcheschi
(74) *Attorney, Agent, or Firm*—Smith, Gambrell & Russell

(57) ABSTRACT

An aqueous dispersion containing a cerium oxide-doped, pyrogenically produced silicon dioxide, wherein the cerium oxide is introduced through an aerosol of a cerium salt solution or suspension and the average particle size in the dispersion is less than 100 nm. The dispersion is produced by dispersing the cerium oxide-doped, pyrogenically produced silicon dioxide in aqueous solution by means of a high energy input. The aqueous dispersion can be used for chemical-mechanical polishing.

28 Claims, No Drawings

AQUEOUS DISPERSIONS, PROCESS FOR THEIR PRODUCTION, AND THEIR USE

INTRODUCTION AND BACKGROUND

The present invention relates to the production of aqueous dispersions that contain pyrogenically produced silicon dioxide, a process for their production, and the use of the dispersions for polishing semiconductor substrates.

Cerium oxide dispersions, obtained by calcining a cerium compound followed by grinding of the oxide, have been used for a long time for polishing glass. The dispersions have particle sizes of more than 1000 nm and a high content of impurities. They are suitable for the coarse polishing of surfaces, but not for polishing sensitive optical surfaces, semiconductor substrates or integrated circuits (chemical-mechanical polishing, CMP).

Smaller cerium oxide particles are obtained by the so-called hydrothermal synthesis. In this case a cerium(III) salt is converted oxidatively under the influence of temperature and pressure into cerium oxide, which crystallizes out in the form of fine particles. The particle sizes of the cerium oxide obtained according to this process are 80-100 nm (EP-A-947 469), 7-50 nm U.S. Pat. No. 5,389,352) or smaller than 30 nm and larger than 60 nm (U.S. Pat. No. 5,772,780). The disadvantage of this method however is that very dilute cerium(III) solutions have to be used as starting materials.

Mixtures of cerium oxide and silicon dioxide produced by the processes mentioned above are described in U.S. Pat. No. 5,891,205. In this case the cerium oxide has to be deagglomerated in a first step by means of a grinding mill. The cerium oxide dispersion is then mixed in a second step with a silicon dioxide dispersion based on silica sol and can be used to planarite silicon discs.

The disadvantage in this case is the complicated procedure and the costs involved in the production of this finely particulate dispersion. The deagglomeration of the cerium oxide using a grinding mill conceals the potential danger of the incorporation of impurities in the dispersion. Furthermore, it is known that silicon dioxide dispersions based on silica sol have a higher content of impurities than those based on pyrogenically produced silicon dioxide.

U.S. Pat. No. 5,382,272 describes the activation of silicon dioxide particles by adsorption of a few weight percent, preferably 2 wt. %, of a cerium oxide or zirconium oxide dispersion. The particular feature of this process is that the activating effect is said to be obtained simply by grinding a silicon dioxide dispersion with a commercially available cerium oxide or zirconium oxide dispersion. The mixed dispersion that is thus obtained is said to behave like a pure cerium oxide dispersion when polishing semiconductor substrates with a high removal rate, but without leaving any scratches on the surface to be polished. Compared to the remaining processes in the prior art, the costs are minimal and the execution is simple. The particular disadvantages of this method are, as is also described in detail in WO 00/17 282 A1, the production of a dispersion having a narrow particle size range and the difficulty in achieving reproducible polishing results.

As the prior art shows, the extraordinarily high activity of cerium oxide compared to silicon dioxide and other dielectric oxides has excited a great deal of interest, mainly in the area of chemical-mechanical polishing (CMP).

It is therefore an object of the invention to easily produce an aqueous, cerium oxide-containing dispersion that contains only a small proportion of impurities, and in which the particle size can be reproducibly adjusted.

SUMMARY OF THE INVENTION

The above and other objects of the invention can be technical object can be achieved by using an aqueous dispersion containing pyrogenically produced silicon dioxide doped with cerium oxide, in which the cerium oxide is introduced through an aerosol of a cerium salt solution or suspension, and where the mean particle size in the dispersion is less than 100 nm.

In the production of the silicon dioxide doped with cerium oxide a cerium salt solution or suspension is used as starting material, which is homogeneously mixed as an aerosol with the gaseous mixture obtained from the flame oxidation or flame hydrolysis of a volatile silicon compound such as for example silicon tetrachloride, hydrogen and oxygen. The aerosol/gaseous mixture is allowed to react in a flame. The resulting pyrogenically produced silicon dioxide doped by means of the aerosol is separated in a known manner from the gas stream.

As is described in detail in DE 196 50 500 A1, this production process leads to silicon dioxide particles doped with cerium oxide. The cerium oxide particles according to this process are always smaller than the silicon dioxide particles. This is an important prerequisite for the use of dispersions containing the cerium oxide-doped silicon dioxide particles for polishing applications, since otherwise scratches could be formed on the surface to be polished.

The dispersion has a good stability and is ideally suitable for polishing in the CMP sector. Good stability of the doped dispersion means that the time after which the viscosity of the dispersion increases or the dispersion gels or sediments is later than in the case of a dispersion containing a mixture of undoped silicon dioxide and cerium oxide.

DETAILED DESCRIPTION OF THE INVENTION

The present invention will now be described in further detail.

As a result of the pyrogenic production process, in which as is known highly pure starting materials are used, the levels of impurities relevant for CMP applications are negligibly small.

With commercially obtained cerium oxide dispersions the cerium oxide is generally obtained from ores having a relatively high content of impurities.

The degree of doping of the silicon dioxide produced by the above process may be varied within wide limits from 0.00001 up to 20 wt. %. When used for the production of an aqueous dispersion according to the present invention, the degree of doping is preferably between 10 ppm and 10 wt. %, particularly preferably in the range between 300 ppm and 5 wt. %.

The BET surface of the cerium oxide-doped silicon dioxide is between 5 and 600 $m^2/g$ according to a preferred embodiment of the invention. A range between 50 and 400 $m^2/g$ is particularly preferred. Within this range the dispersion exhibits a good stability.

The solids content of the dispersion containing cerium oxide-doped silicon dioxide is primarily governed by its intended use. In order to reduce transportation costs a dispersion with the maximum possible solids content is aimed for, whereas for certain applications, such as for example the polishing of silicon discs, dispersions with low solids contents are used. A solids content of 0.1 to 70 wt. % is preferred according to the invention, the range between 1 and 30 wt. % being particularly preferred. In this range the cerium oxide-doped dispersion exhibits a good stability.

The dispersion may be used as such, for example for polishing. The pH of this dispersion is between 3.5 and 4 depending on the degree of doping. The pH may however be varied in a wide pH range of ca. 3–11 by adding basically or acidically acting substances.

An increase in the pH value may preferably be achieved by adding alkali hydroxides or amines. Ammonium hydroxide and potassium hydroxide are particularly preferred.

By adding acids the pH can be displaced to the acidic range down to pH 3. There are preferably used for this purpose carboxylic acids of the general formula $C_nH_{2n-1}CO_2H$ where n=0–6 or n=8,10,12,14,16, or dicarboxylic acids of the general formula $HO_2C(CH_2)_nCO_2H$ where n=0–4, or hydroxy-carboxylic acids of the general formula $R_1R_2C(OH)CO_2H$ where $R_1$=H, $R_2$=$CH_3$, $CH_2CO_2H$, $CH(OH)CO_2H$ or glycolic acid, pyruvic acid, salicylic acid or mixtures of the aforementioned acids. Acetic acid, citric acid and salicylic acid are particularly preferred for this purpose.

The present invention also provides a process for the production of the dispersion containing cerium oxide-doped silicon dioxide, which is characterized in that the cerium oxide-doped, pyrogenically produced silicon dioxide is dispersed in aqueous solution by means of a high energy input. Dispersion methods in which a sufficiently high energy input permits a dispersion of even extremely hard and highly aggregated materials are suitable for this purpose. Such methods include systems operating according to the rotor-stator principle, for example Ultra-Turrax machines, or agitator ball mills. Both systems however have a relatively low energy input. Significantly higher energy inputs are possible with a planetary kneader/mixer. The effectiveness of this system is however dependent on a sufficiently high viscosity of the processed mixture, in order to impart the high shear energies needed to separate the particles.

When grinding and dispersing doped oxide particles there is the danger that the doping substance will separate out during the grinding and dispersion. This leads to variable polishing results if the dispersion is to be used as a polishing agent in the CMP process.

It has now been found that aqueous dispersions containing cerium oxide-doped silicon dioxide particles that are smaller than 100 nm and in which the doping substances has not separated out can be obtained by using high-pressure homogenizers.

With these devices two pre-dispersed suspension streams under a pressure of up to 3500 kg/cm$^2$ are expanded through a diamond nozzle. Both dispersion jets strike one another exactly and the particles undergo a mutual grinding. In another embodiment the pre-dispersion is also subjected to a high pressure, but in this case the particles collide against reinforced wall regions.

These devices have been used for a long time, among other things to disperse undoped oxides such as zinc oxide, silicon dioxide or aluminium oxide (UK-A-2 063 695, EP-A-876 841, EP-A-773 270, WO 00/172 282 A1). The grinding and dispersion of doped oxides using these devices has not been described up to now.

The invention also provides for the use of the aqueous, cerium oxide-doped dispersion for the chemical-mechanical polishing (CMP) of semiconductor substrates or layers applied to the latter. By using the cerium oxide-doped dispersion, a surface that is free of microscratches can be obtained at a high polishing rate.

The cerium oxide-doped dispersion according to the invention is particularly suitable for the final chemical-mechanical polishing in the shallow-trench isolation process (STI process), in which after applying a silicon nitride layer insulating structures are etched in the silicon layer of a wafer, these cavities are then filled with silicon dioxide, and excess silicon dioxide is removed by chemical-mechanical polishing.

These dispersions are also suitable for the production of very finely particulate surface coatings in the paper-making industry or to produce special glasses.

EXAMPLES

Analytical process

The average secondary particle size was determined with a Zetasizer 3000 Hsa from the Malvern company.

The surface of the powders that were used was determined by the method of S. Brunauer, P. H. Emmet and I. Teller, J. Am. Chemical Society, Vol. 60, p. 309 (1938) and is generally termed the BET surface.

The viscosity of the dispersions that were produced was determined with a rotation rheometer, Model MCR 300, from Physica and with a CC 27 measurement beaker. The viscosity value was measured at a shear rate of 100 1/sec. This shear rate is in a range in which the viscosity is practically independent of the shear stress.

Sediment formation was evaluated by visual inspection in a 1000 ml capacity wide-necked polyethylene flask after a standing time of one week. Any sediment that may be present can easily be recognised by carefully tilting the flask.

The synthesis of the cerium oxide-doped silicon dioxide particles is carried out according to DE 196 50 500.

Production of the dispersions

Method A: 53 kg of fully deionized water and 80 g of 30% KOH solution are placed in a 60 l stainless steel batch container. 8 kg of the particles according to Examples 1 to 8 are sucked in as a powder and coarsely pre-dispersed with the aid of a disperser and suction mixer from Ystral (at 4500 r.p.m.). After the introduction of the powder the dispersion is completed with a Type Z 66 rotor/stator throughflow homogenizer from Ystral with four processing crowns, a stator slit width of 1 mm, and a rotational speed of 11,500 r.p.m. During this 15-minute dispersion at 11,500 r.p.m. the pH is adjusted and maintained at a of 9.5 by adding further KOH solution. In this connection a further 96 g of KOH solution were used and an abrasive body concentration of 12.5 wt. % was adjusted by adding 2.8 kg of water.

Method B: about half the dispersion according to method A is ground with a “wet jet mill”, Ultimaizer System from Sugino Machine Ltd., model HJP-25050, at a pressure of 250 MPa and with a diamond nozzle diameter of 0.3 mm and two grinding passes.

The analytical data of the dispersions are shown in Table 1.

Polishing process

Equipment: Presi Polisher Type 460 M, equipped with a 550 mm polishing table with a Rodel IC 1400 perforated polishing cloth.

Wafer: 4" silicon discs coated with 500 nm $SiO_2$ (thermally produced), 4" silicon discs coated with 500 nm $Si_3N_4$ (LPCVD).

Polishing parameters:

Polishing duration/polishing pressure: 15 secs./0.2 bar, 60 secs./0.8 bar, 15 secs./0.2 bar, with rinsing Rotational velocity 60 rpm (both)

Metering rate of the dispersion: 100 ml/min.

Temperature: ca. 25° C.

Preliminary treatment: treatment with a diamond-tipped grinding head disc at a pressure of 1 bar for 10 secs. before each polishing test.

Post CMP cleaning is carried out by ultrasonic cleaning (Techsonic) and using a SVG 8620 brush-type cleaner (single side cleaner/dryer).

The evaluation of the abrasion performance (removal rate, RR) is carried out by measuring the layer thickness using a Prometrix FDT 650 device (KLA-Tencor Corporation) and by weighing the wafer on a Sartorius BP 210D scales. 10 wafers were polished and evaluated in each case to determined the mean RR.

Large scratches and defects were evaluated with a Surfscan Model 5000 device from Tencor.

The values for the abrasion performances and the selectivities of the dispersions according to Examples 1 to 8 are summarised in Table 2

Further variations and modifications of the foregoing will be apparent to those skilled in the art and are intended to be encompassed by the claims appended hereto.

German priority application 100 54 345.6 is relied on and incorporated herein by reference.

TABLE 1

Analytical data of the dispersions obtained according to Examples 1 to 8

| Example | Method | $CeO_2$-Doping [wt. %] | BET-Surface [$m^2/g$] | Mean Particle Diameter (Number) [nm] | Mean Particle Diameter (Volume) [nm] | Viscosity [mPa · s] | Deposit |
|---|---|---|---|---|---|---|---|
| 1 | A | none* | 90 | 197 | 271 | 7 | yes |
| 2 | B | none* | 90 | 150 | 163 | 3 | no |
| 3 | A | 0.11 | 83 | 185 | 251 | 3 | yes |
| 4 | B | 0.11 | 83 | 84 | 96 | 2 | no |
| 5 | A | 0.34 | 79 | 190 | 257 | 3 | yes |
| 6 | B | 0.34 | 79 | 78 | 92 | 2 | no |
| 7 | A | 0.71 | 81 | 181 | 261 | 3 | yes |
| 8 | B | 0.71 | 81 | 91 | 99 | 2 | no |

*Aerosil 90, Degussa AG.

TABLE 2

Mean removal rates (RR) and $SiO_2/Si_3N_4$ selectivities of the dispersions produced according to Examples 1 to 8

| | Thermal $SiO_2$ | | $Si_3N_4$ | | Selectivity | | |
|---|---|---|---|---|---|---|---|
| Examples | weighing [nm/min] | Prometrix [nm/min] | weighing [nm/min] | Prometrix [nm/min] | RR $SiO_2$/RR $Si_3N_4$ weighing | Prometrix | Scratches/Defects |
| 1 | 1078 | 1005 | 325 | 303 | 3.3 | 3.4 | some |
| 2 | 1023 | 956 | 321 | 313 | 3.3 | 3.3 | none |
| 3 | 1153 | 1072 | 331 | 315 | 3.5 | 3.4 | a few |
| 4 | 1197 | 1021 | 339 | 293 | 3.5 | 3.5 | none |
| 5 | 1337 | 1275 | 311 | 298 | 4.3 | 4.3 | a few |
| 6 | 1297 | 1226 | 299 | 292 | 4.3 | 4.2 | none |
| 7 | 1627 | 1558 | 316 | 310 | 5.1 | 5.0 | a few |
| 8 | 1580 | 1506 | 305 | 308 | 5.2 | 4.9 | none |

What is claimed is:

1. An aqueous dispersion comprising cerium oxide-doped, pyrogenically produced silicon dioxide particles, wherein the cerium oxide is homogeneously introduced through an aerosol of cerium salt solution or suspension into a gaseous mixture obtained from the flame oxidation or flame hydrolysis of a volatile silicon compound and the resulting cerium oxide-doped silicon dioxide has an average particle size in the dispersion of less than 100 nm.

2. The aqueous dispersion according to claim 1, in which the cerium oxide content of the doped silicon dioxide range from 10 ppm to 10 wt. %.

3. The aqueous dispersion according to claim 1, wherein the cerium oxide-doped silicon dioxide has a BET surface area in the range from 5 to 600 $m^2/g$.

4. The aqueous dispersion according to claim 2, wherein the cerium oxide-doped silicon dioxide has a BET surface area in the range from 5 to 600 $m^2/g$.

5. The aqueous dispersion according to claim 1, in which has a solids content in the dispersion of from 0.1 to 70 wt. %.

6. The aqueous dispersion according to claim 2, which has a solids content in the dispersion of from 0.1 to 70 wt. %.

7. The aqueous dispersion according to claim 3, which has a solids content in the dispersion is of from 0.1 to 70 wt. %.

8. The aqueous dispersion according to claim 1, wherein the dispersion is has a pH value from 3 to 11.

9. The aqueous dispersion according to claim 2, wherein the dispersion is has a pH value from 3 to 11.

10. The aqueous dispersion according to claim 3, wherein the dispersion is has a pH value from 3 to 11.

11. The aqueous dispersion according to claim 4, wherein the dispersion is has a pH value from 3 to 11.

12. The aqueous dispersion according to claim 1, wherein the aqueous dispersion has a pH value adjusted with amines or alkali hydroxides.

13. The aqueous dispersion according to claim 2, wherein the aqueous dispersion has a pH value adjusted with amines or alkali hydroxides.

14. The aqueous dispersion according to claim 3, wherein the aqueous dispersion has a pH value adjusted with amines or alkali hydroxides.

15. The aqueous dispersion according to claim 4, wherein the aqueous dispersion has a pH value adjusted with amines or alkali hydroxides.

16. The aqueous dispersion according to claim 5, wherein the aqueous dispersion has a pH value adjusted with amines or alkali hydroxides.

17. The aqueous dispersion according to claim 1, further comprising adjusting the pH value by adding a carboxylic acid of the formula $C_nH_{2n+}CO_2H$, where n=0–6 or n=8, 10, 12, 14, 16; or dicarboxylic acid of the formula $HO_2C(CH_2)$ $_n$$CO_2H$, where n=0–4; or hydroxycarboxylic acids of the general formula $R_1R_2C(OH)CO_2H$, where $R_1$=H, $R_2$=$CH_3$, $CH_2CO_2H$, $CH(OH)CO_2H$; or glycolic acid; pyruvic acid; salicylic acid or mixtures thereof.

18. A process for the production of the aqueous dispersion according to claim 1, comprising dispersing cerium oxide-doped pyrogenically produced silicon dioxide in aqueous solution by means of a high energy input.

19. The process for the production of an aqueous dispersion according to claim 18, further comprising grinding and dispersing said cerium oxide-doped silicon dioxide in an aqueous solvent, by subjecting particles to be dispersed to pressure of up to 3500 kg/$cm^2$, and expanding said particles through a nozzle, and causing said particles to collide with one another or against a wall.

20. A process for the chemical-mechanical polishing of a semiconductor substrate or of a layer applied thereto by subjecting said substrate or layer to polishing action by the aqueous dispersion of claim 1.

21. A process for producing a finely particulate surface coating on paper comprising subject paper to the aqueous dispersion of claim 1 for coating the paper.

22. A process for treating a glass surface comprising polishing said glass with the aqueous dispersion according to claim 1.

23. An aqueous dispersion comprising cerium oxide-doped pyrogenically produced silicon, wherein the cerium oxide is in the form of a solution or suspension and is homogeneously mixed as an aerosol with a gaseous mixture obtained from flame oxidation or flame hydrolysis of a volatile silicon compound and allowed to react in a flame, wherein the cerium oxide-doped silicon dioxide has an average particle size in the dispersion of less than 100 nm.

24. A coated paper, coated with the aqueous dispersion of claim 1.

25. A glass surface coated with the aqueous dispersion of claim 1.

26. A semiconductor substrate having been polished with the aqueous dispersion of claim 1.

27. An aqueous dispersion comprising a cerium oxide-doped pyrogenically produced silicon dioxide, wherein the cerium oxide as a dopant is introduced through an aerosol of cerium salt solution or suspension and the average cerium oxide doped silicon dioxide has a particle size in the dispersion of less than 100 nm, and where the cerium oxide dopant does not become detached as the dispersion is prepared using a high pressure homogenizer.

28. An aqueous dispersion comprising water and cerium oxide-doped, pyrogenically produced silicon dioxide particles, wherein the said particles are produced by introducing an aerosol of cerium salt solution or suspension into a gaseous mixture obtained from the flame oxidation or flame hydrolysis of a volatile silicon compound, said dispersion having been produced by subjecting said cerium oxide doped silicon dioxide particles to pressure of up to 3500 kg/$cm^2$ and expanding said particles through a nozzle thereby causing said particles to collide with one another or against a wall to thereby obtain a dispersion wherein said particles in said dispersion have an average particle size of less than 100 nm.

* * * * *